(12) United States Patent
Dekker et al.

(10) Patent No.: US 9,230,908 B2
(45) Date of Patent: Jan. 5, 2016

(54) THROUGH-WAFER VIA DEVICE AND METHOD OF MANUFACTURING THE SAME

(71) Applicant: KONINKLIJKE PHILIPS N.V., Eindhoven (NL)

(72) Inventors: Ronald Dekker, Valkenswaard (NL); Marcelis Bout, Noord-Brabant (NL); Marcel Mulder, Eindhoven (NL); Ruediger Mauczok, Erkelenz (DE)

(73) Assignee: Koninklijke Philips N.V., Eindhoven (NL)

( * ) Notice: Subject to any disclaimer, the term of this patent is extended or adjusted under 35 U.S.C. 154(b) by 0 days.

(21) Appl. No.: 14/346,824

(22) PCT Filed: Oct. 12, 2012

(86) PCT No.: PCT/IB2012/055547
§ 371 (c)(1),
(2) Date: Mar. 24, 2014

(87) PCT Pub. No.: WO2013/057642
PCT Pub. Date: Apr. 25, 2013

(65) Prior Publication Data
US 2014/0293751 A1 Oct. 2, 2014

Related U.S. Application Data

(60) Provisional application No. 61/547,942, filed on Oct. 17, 2011.

(51) Int. Cl.
| | | |
|---|---|---|
| *H01L 23/00* | (2006.01) | |
| *H01L 23/522* | (2006.01) | |
| *H01L 21/768* | (2006.01) | |
| *H01L 23/48* | (2006.01) | |
| *B06B 1/02* | (2006.01) | |
| *H01L 23/532* | (2006.01) | |

(52) U.S. Cl.
CPC .......... *H01L 23/5226* (2013.01); *B06B 1/0292* (2013.01); *H01L 21/76898* (2013.01);

(Continued)

(58) Field of Classification Search
CPC .................................. H01L 23/53271
USPC .................. 257/774, 621; 367/181
See application file for complete search history.

(56) References Cited

U.S. PATENT DOCUMENTS

| 5,381,385 A | 1/1995 | Greenstein | |
|---|---|---|---|
| 5,619,476 A * | 4/1997 | Haller et al. | 367/181 |

(Continued)

FOREIGN PATENT DOCUMENTS

WO 2005088699 A1 9/2005

OTHER PUBLICATIONS

Calmes et al, "Highly Integrated 2-D Capacitive Micromachined Ultrasonic Transducer", IEEE Ultrasonics Symposium Proceedings, Jan. 1, 1999, pp. 1163-1166.

*Primary Examiner* — Luke Ratcliffe
*Assistant Examiner* — Hovhannes Baghdasaryan

(57) ABSTRACT

The present invention relates to a through-wafer via device (10) comprising a wafer (12) made of a wafer material and having a first wafer surface (12*a*) and a second wafer surface (12*b*) opposing the first wafer surface (12*a*). The through-wafer via device (10) further comprises a plurality of side by side first trenches (14) provided with a conductive material and extending from the first wafer surface (12*a*) into the wafer (12) such that a plurality of spacers (16) of the wafer material are formed between the first trenches (14). The through-wafer via device (10) further comprises a second trench (18) provided with the conductive material and extending from the second wafer surface (12*b*) into the wafer (12), the second trench (18) being connected to the first trenches (14). The through-wafer via device (10) further comprises a conductive layer (20) made of the conductive material and formed on the side of the first wafer surface (12*a*), the conductive material filling the first trenches (14) such that the first conductive layer (20) has a substantially planar and closed surface.

20 Claims, 5 Drawing Sheets

(52) U.S. Cl.
CPC ........ *H01L23/481* (2013.01); *H01L 23/53271* (2013.01); *H01L 2224/02372* (2013.01); *H01L 2224/0401* (2013.01); *H01L 2224/05548* (2013.01); *H01L 2224/131* (2013.01); *H01L 2224/13024* (2013.01); *H01L 2224/16145* (2013.01); *H01L 2924/1461* (2013.01)

(56) References Cited

U.S. PATENT DOCUMENTS

| | | |
|---|---|---|
| 6,430,109 B1 | 8/2002 | Khuri-Yakub et al. |
| 7,622,848 B2 | 11/2009 | Lee |
| 7,728,490 B2 | 6/2010 | Adachi |
| 7,781,238 B2 | 8/2010 | Wodnicki |
| 7,846,102 B2 | 12/2010 | Kupnik |
| 2004/0018712 A1 | 1/2004 | Plas et al. |
| 2004/0104454 A1 | 6/2004 | Takaoka et al. |
| 2004/0141421 A1 | 7/2004 | Cheng et al. |
| 2005/0094490 A1* | 5/2005 | Thomenius et al. .......... 367/155 |
| 2008/0203556 A1 | 8/2008 | Huang |
| 2009/0309217 A1 | 12/2009 | Sudol |
| 2010/0025785 A1 | 2/2010 | Robinson |
| 2010/0168583 A1* | 7/2010 | Dausch et al. ................ 600/466 |
| 2010/0264548 A1 | 10/2010 | Sanders et al. |

\* cited by examiner

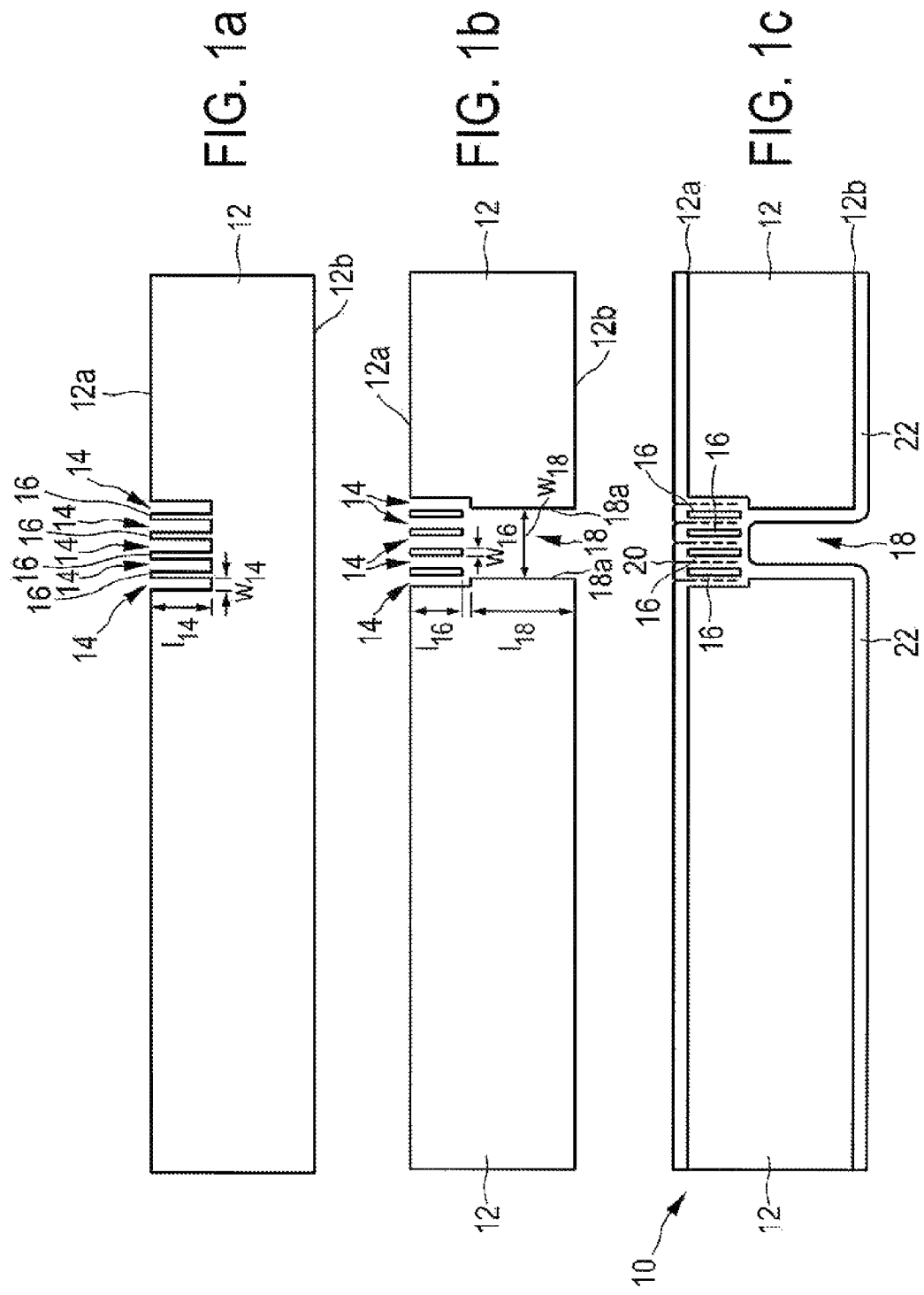

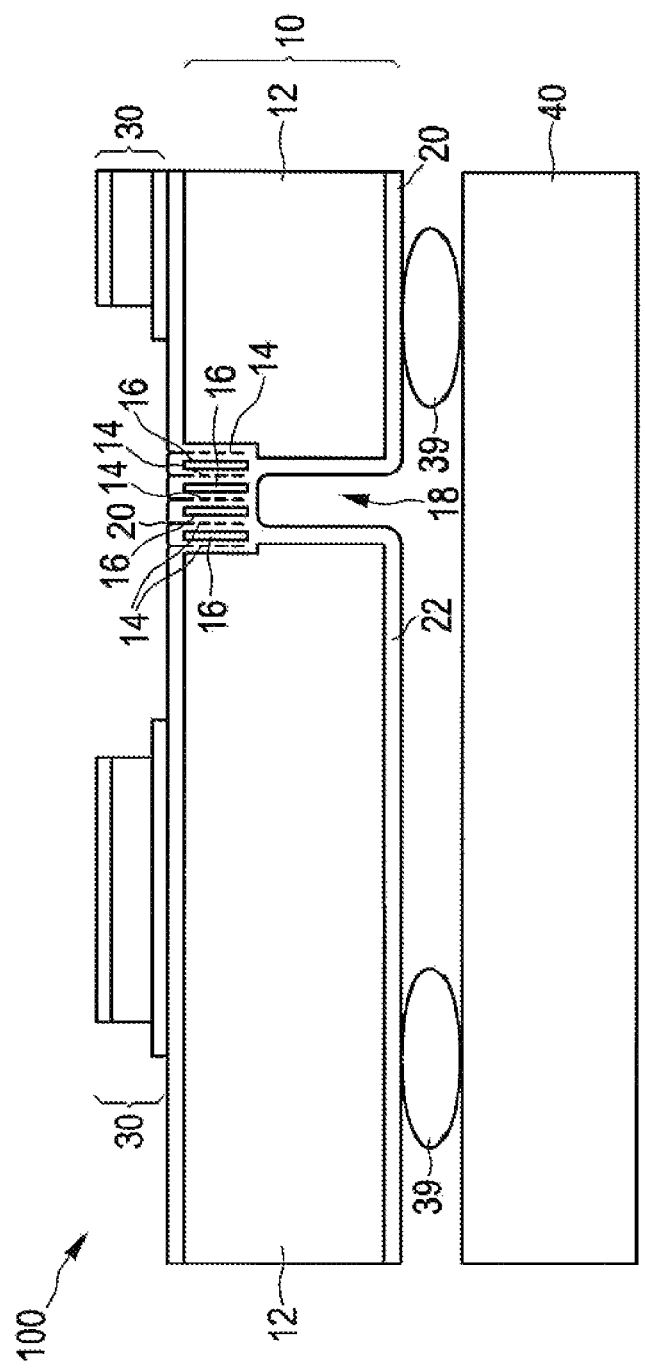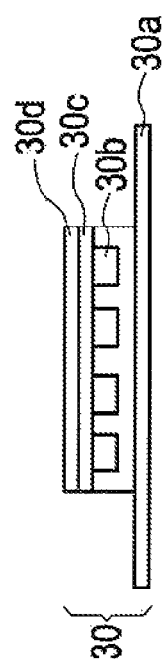

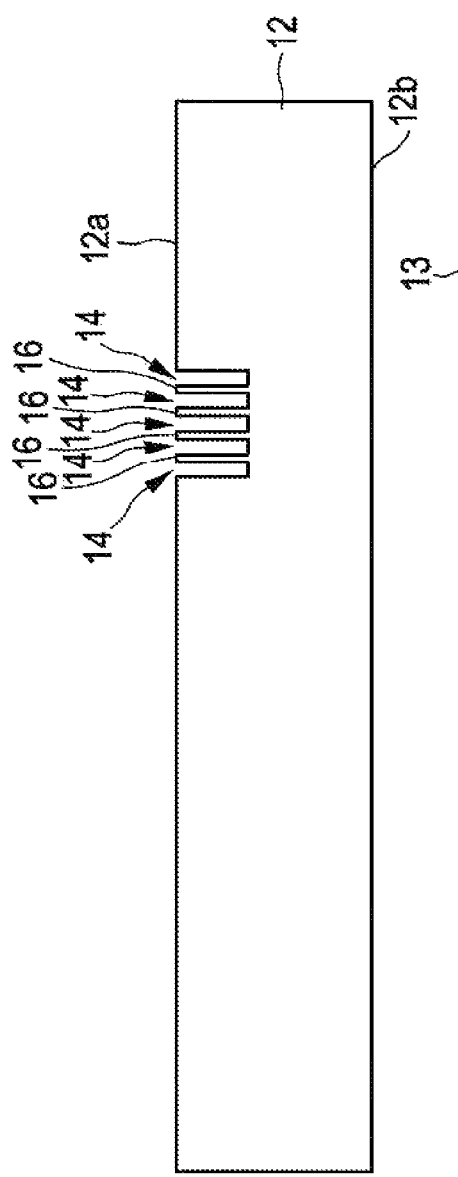
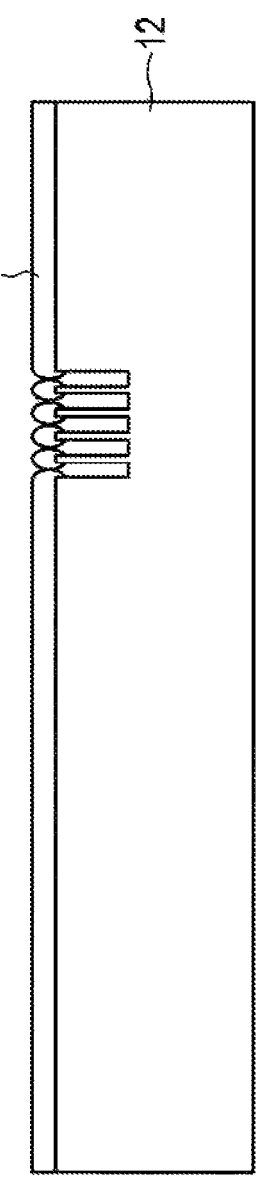
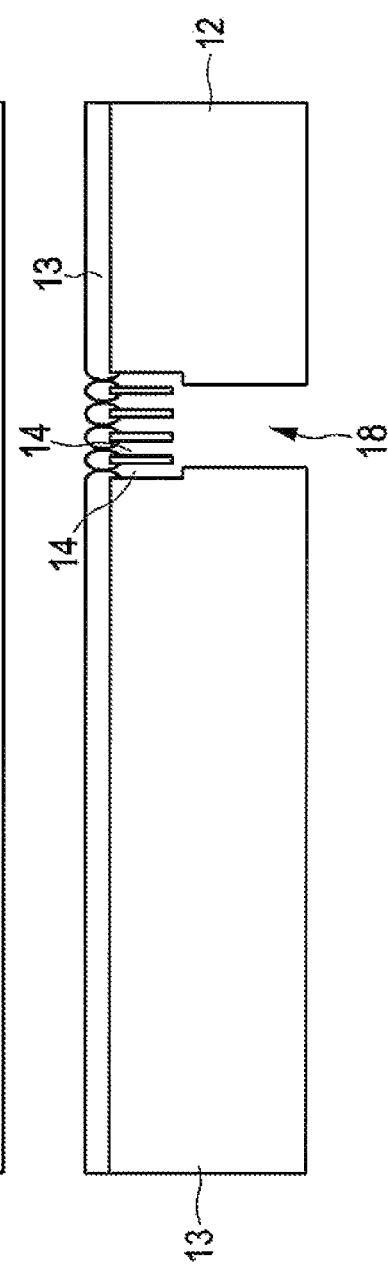

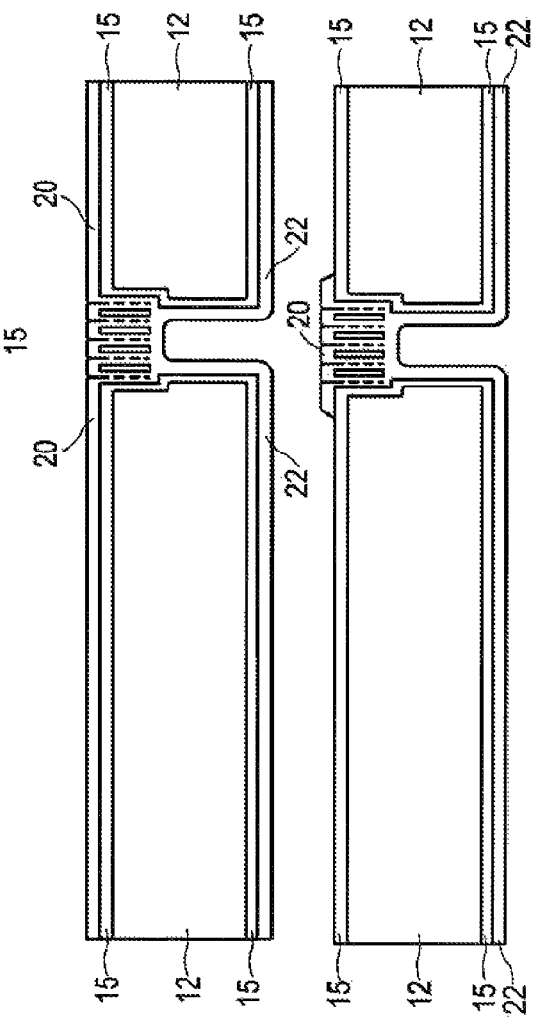

THROUGH-WAFER VIA DEVICE AND METHOD OF MANUFACTURING THE SAME

CROSS-REFERENCE TO PRIOR APPLICATIONS

This application is the U.S. National Phase application under 35 U.S.C. §371 of International Application No. PCT/IB2012/055547, filed on Oct. 12, 2012, which claims the benefit of U.S. Provisional Application No. 61/547,942, on Oct. 17, 2011. These applications are hereby incorporated by reference herein.

FIELD OF THE INVENTION

The present invention relates to through-wafer via device and method of manufacturing the same, in particular for use in a capacitive micromachined transducer (CMUT) assembly. The present invention further relates to a capacitive micromachined ultrasound transducer (CMUT) assembly comprising such through-wafer via device and comprising at least one cMUT cell.

BACKGROUND OF THE INVENTION

The heart of any ultrasound (imaging) system is the transducer which converts electrical energy in acoustic energy and back. Traditionally these transducers are made from piezoelectric crystals arranged in linear (1-D) transducer arrays, and operating at frequencies up to 10 MHz. However, the trend towards matrix (2-D) transducer arrays and the drive towards miniaturization to integrate ultrasound (imaging) functionality into catheters and guide wires has resulted in the development of so called capacitive micromachined ultrasound transducers (CMUT) cells. These CMUT cells can be placed or fabricated on top of an ASIC (Application Specific IC) containing the driver electronics and signal processing. This will result in significantly reduced assembly costs and the smallest possible form factor.

Preferably the CMUT cells are fabricated in a separate dedicated technology which is optimized for performance and placed on top of the ASIC. An important question which then needs to be addressed is how the CMUT cells are to be connected to the ASIC. One solution is to use a through-wafer via device. The through-wafer via device, manufactured with a suitable through-wafer via hole technology, can then be used to connect the CMUT cells on the front surface of the wafer to contacts on the backside surface of the wafer. In this way the CMUT cells can be "flip-chipped" (e.g. by solder bumping) to the ASIC.

US 2008/0203556 A1 discloses a through-wafer interconnect and a method for fabricating the same. The method starts with a conductive wafer to form a patterned trench by removing material of the conductive wafer. The patterned trench extends in depth from the front side to the backside of the wafer, and has an annular opening generally dividing the conductive wafer into an inner portion and an outer portion whereby the inner portion of the conductive wafer is insulated from the outer portion and serves as a through-wafer conductor. A dielectric material is formed or added into the patterned trench mechanical to support and electrically insulate the through-wafer conductor.

However, this through-wafer interconnect and method for fabricating the same require the trench to be filled with a mechanically strong and electrically isolating dielectric which needs to be able to withstand high temperature processing steps required for the fabrication of the CMUT cells.

There is a need to further improve such through-wafer interconnect and method for fabricating the same.

SUMMARY OF THE INVENTION

It is an object of the present invention to provide an improved through-wafer via device and method of manufacturing the same, as well as an improved capacitive micromachined ultrasound transducer (CMUT) assembly.

According to a first aspect of the present invention a through-wafer via device is presented comprising a wafer made of a wafer material and having a first wafer surface and a second wafer surface opposing the first wafer surface. The through-wafer via device further comprises a plurality of side by side first trenches provided with a conductive material and extending from the first wafer surface into the wafer such that a plurality of spacers of the wafer material are formed between the first trenches. The through-wafer via device further comprises a second trench provided with the conductive material and extending from the second wafer surface into the wafer, the second trench being connected to the first trenches. The through-wafer via device further comprises a conductive layer made of the conductive material and formed on the side of the first wafer surface, the conductive material filling the first trenches such that the first conductive layer has a substantially planar and closed surface.

According to a further aspect of the present invention a capacitive micromachined ultrasound transducer (CMUT) assembly is presented comprising the through-wafer via device according to the invention, and comprising at least one CMUT cell electrically connected to the first conductive layer.

According to a further aspect of the present invention a method of manufacturing a through-wafer via device is presented, the method comprising:
providing a wafer made of a wafer material and having a first wafer surface and a second wafer surface opposing the first wafer surface,
etching a plurality of side by side first trenches from the first wafer surface into the wafer such that a plurality of spacers of the wafer material are formed between the first trenches,
etching a second trench from the second wafer surface into the wafer, the second trench being connected to the first trenches,
providing a conductive layer made of a conductive material on the side of the first wafer surface, the conductive material filling the first trenches such that the first conductive layer has a substantially planar and closed surface.

The basic idea of the invention is to provide a (high-temperature) through-wafer via device (or through-wafer interconnect device) comprising a first conductive layer having a substantially planar (or flat) and preferably closed (in particular void-free and/or cavity-free) surface. The surface needs to be planar and closed e.g. to allow for resist spinning, particularly so that the wafer can be held by a vacuum chuck which is present in many pieces of equipment during fabrication. The substantially planar and closed surface is obtained using a processing trick, in which a mesh or grid of side by side (fine) first trenches is provided (e.g. etched) from the first wafer side and a conductive material (e.g. polysilicon) is filled in the first trenches (e.g. the first trenches being fully filled or closed with the conductive material). Therefore the processing is quite easy as the trick with the fine trenches will automatically result in a planar surface. This means a saving in (difficult) process steps and hence a reduction in cost.

In particular for a CMUT assembly, the through-wafer via device can be manufactured in the beginning, and afterwards the CMUT cells can be attached to the through-wafer via device. This order of processing has the particular advantage that for the fabrication of the through wafer via process steps can be used which would be incompatible with the layers and structure of the CMUT assembly. An example is the deposition/growth of high quality conformal dielectric layers which is done at temperatures starting from 700° C. which are incompatible with the metal layers in the CMUT device.

Additionally, the requirements for the through-wafer via resistance are less stringent as compared to other devices (e.g. stacked memory devices). This makes it possible to use (in-situ doped) polysilicon as the conductive layer for the filling of the through-wafer via, in this way advantageously using the conformal deposition property of polysilicon.

Preferred embodiments of the invention are defined in the dependent claims. It shall be understood that the claimed method or CMUT assembly has similar and/or identical preferred embodiments as the claimed device and as defined in the dependent claims.

In a first embodiment, the device further comprises a second conductive layer made of the conductive material and formed on the second wafer surface. In this way an electrical connection to an ASIC can be provided.

In a variant of this embodiment, the through-wafer via device comprises the conductive material on the surfaces of the second trench such that the first conductive layer and the second conductive layer are electrically connected. In this way a through-wafer via (or through-wafer interconnect) can be provided.

In a further variant of this embodiment, the second conductive layer is formed on at least part of the second wafer surface surrounding the second trench.

In a further variant of this embodiment, the through-wafer via device further comprises an electrical connection between the second conductive layer and an ASIC. In this way the through-wafer via device can be "flip-chipped" (e.g. by solder bumping) to the ASIC. When used in a CMUT assembly, the ASIC can in particular be used for providing electrical signals to the at least one CMUT cell and/or for receiving electrical signals from the at least one CMUT cell.

In a further embodiment, the second trench has a width extending across a substantial part of or all of the first trenches and/or spacers. In this way the second trench is effectively connected to the first trenches.

In a further embodiment, a width of each first trench and/or of each spacer is in the range between 0.5 μm and 5 μm. These values are in particular advantageous for providing a substantially planar surface of the first conductive layer.

In a further embodiment, the depth of each first trench and/or of each spacer is below 100 μm, in particular below 40 μm. In this way the first trenches and spacers do not extend through the whole wafer, which is usually thicker than 100 μm. The first trenches and spacers have a depth that is only a sub-portion of the overall wafer thickness.

In a further embodiment, the aspect ratio of the first trenches and/or the second trenches is between 10 and 30, in particular about 20. This is a normal etching ratio by which the etching process is limited.

In a further embodiment, the wafer further comprises an electrically insulating surface layer. In this way it is ensured that the wafer material is not electrically connected to the conductive material.

In a further embodiment, the CMUT cell comprises a bottom electrode, a cavity, a membrane arranged on the cavity, and a top electrode. This is a basic embodiment of a CMUT cell.

BRIEF DESCRIPTION OF THE DRAWINGS

These and other aspects of the invention will be apparent from and elucidated with reference to the embodiment(s) described hereinafter. In the following drawings FIG. 1a-c each shows a cross-section of a through-wafer via device according to a first embodiment in a different manufacturing stage, FIG. 2 shows a CMUT assembly according to a first embodiment, FIG. 2a shows a cross-section of a CMUT cell, FIG. 3a-g each shows a cross-section of a through-wafer via device according to a second embodiment in a different manufacturing stage.

DETAILED DESCRIPTION OF THE INVENTION

Figure 4:
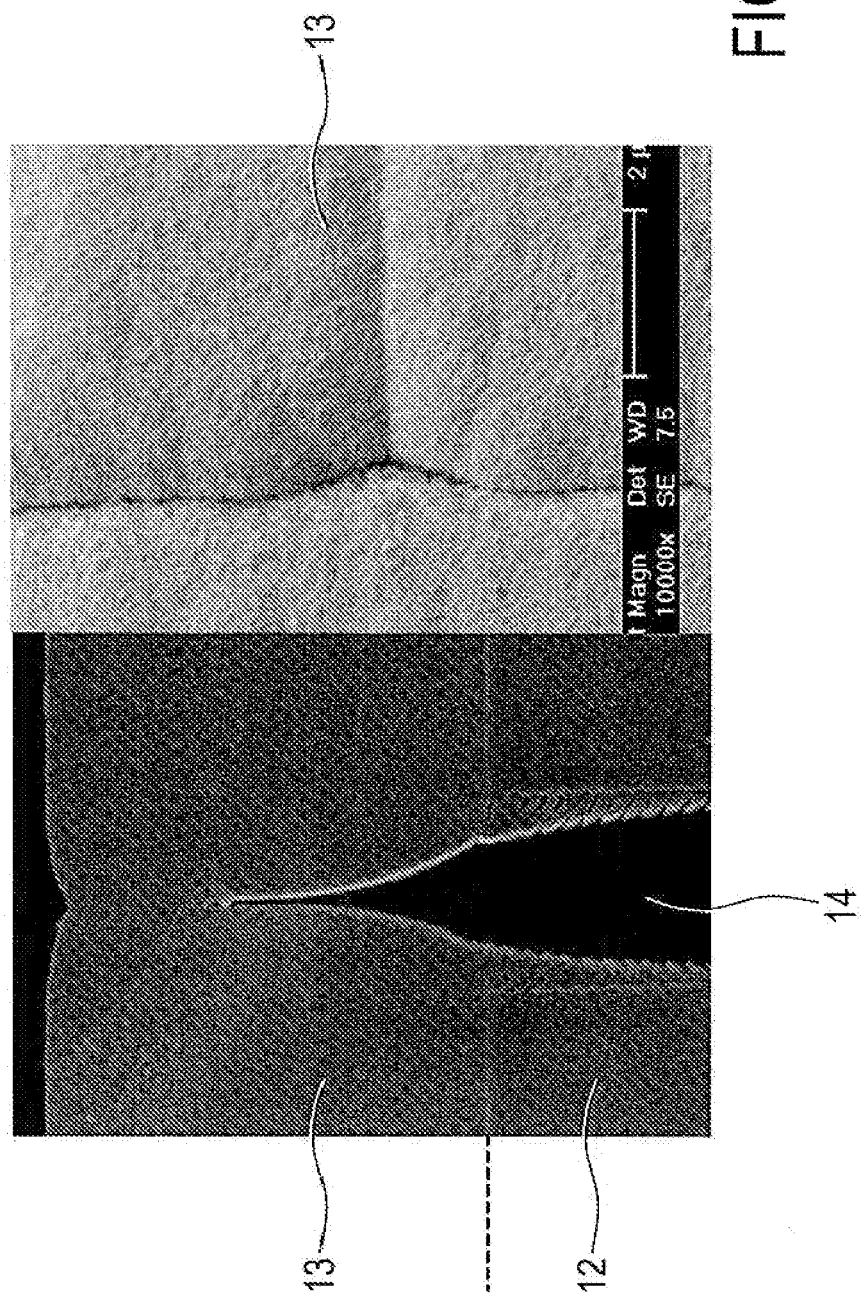
FIG. 4 shows a cross-section and a top-view of the through-wafer via device in the manufacturing stage of FIG. 3b or FIG. 3c.

FIG. 1a-c each shows a cross-section of a through-wafer via device according to a first embodiment in different manufacturing stages. FIG. 1c shows the finished through-wafer via device 10 according to the embodiment. The through-wafer via device 10 comprises a wafer 12 made of a wafer material and having a first wafer surface 12a and a second wafer surface 12b opposing the first wafer surface 12a. The through-wafer via device 10 further comprises a plurality of side by side first trenches 14 provided with a conductive material and extending from the first wafer surface 12a into the wafer 12 such that a plurality of spacers 16 of the wafer material are formed between the first trenches 14. The through-wafer via device 10 further comprises a second trench 18 provided with the conductive material and extending from the second wafer surface 12b into the wafer 12. The second trench 18 (provided with the conductive material) is connected to the first trenches 14 (provided with the conductive material). By means of the first trenches 14 and the second trench 18 a via is formed through the entire wafer. The through-wafer via device 10 further comprises a conductive layer 20 made of the conductive material and formed on the side of the first wafer surface 12a, the conductive material filling the first trenches 14 such that the first conductive layer 20 has a substantially planar, in particular void-free and/or cavity-free, and preferably closed surface.

The wafer material can be an electrically conductive or semi-conductive material. In this case, the conductive layer and the electrically conductive or semi-conductive wafer material are not in direct contact, but electrically insulated from each other, e.g. by a (not shown) insulation layer. Thus, the wafer 12 can further comprise an electrically insulating surface layer, e.g. provided by oxidation. Alternatively, the wafer material can be an electrically insulating material. In this case, the conductive layer may be directly applied on the electrically insulating wafer material.

As shown in FIG. 1c, the through-wafer via device can further comprise a second conductive layer 22 made of the conductive material and formed on the second wafer surface 12b. The second conductive layer 22 is formed on at least part of the second wafer surface 12b surrounding the second trench 18. An electrical connection is provided between the first conductive layer 20 and the second conductive layer 22.

The conductive material is provided on the surfaces of the second trench 18 such that the first conductive layer 20 and the second conductive layer 22 are electrically connected. Preferably, the first conductive layer 20 and the second conductive layer 22 are made of the same conductive material (e.g. applied in the same processing step), in particular forming a common layer made of the same conductive material, as can be seen in FIG. 1c. In this example, in the same processing step, the conductive material is applied to the first wafer surface 12a (thereby forming the first conductive layer 20), the first trenches 14, the surfaces of the second trench 18 and the second wafer surface 12b (thereby forming the second conductive layer 22). In other words, the conductive material is applied such that an electrical connection between the first wafer surface 12a (or first conductive layer 20) and the second wafer surface 12b (or second conductive layer 22) is provided.

The second trench 18 has a width $w_{18}$ extending across a substantial part of the first trenches 14 and spacers 16 (or all trenches and spacers except for the outermost first trenches). It shall be noted in here that this embodiment provides the preferred situation in which the backside (second) trench 18 is perfectly aligned to the frontside (first) trenches 14. Other embodiments, however, still work if the backside trench 18 is not perfectly aligned as long as there is an electrical connection and the resistance is low enough.

A width $w_{14}$ of each first trench 14 can for example be in the range between 0.5 μm and 5 μm. Alternatively or cumulatively, a width $w_{16}$ of each spacer 16 can for example be in the range between 0.5 μm and 5 μm. A depth $l_{14}$ of each first trench 14 can be below 100 μm, in particular below 40 μm. Alternatively or cumulatively, a depth $l_{16}$ of each spacer 16 can be below 100 μm, in particular below 40 μm. An aspect ratio of the first trenches 14 and/or the second trenches 16 can be between 10 and 30, in particular about 20.

Just as an example, the width of each of the first trenches 14 can be about 1.5 μm and/or the width of the (remaining) spacers 16 can be about 1 μm, but is not limited thereto. Again, just as an example, the depth of each of the first trenches can be about 30 μm to 40 μm, but is not limited thereto. Just as an example, the width of the second trench 18 (or via) can be as small as about 20 μm based on a wafer thickness of about 400 μm and a maximal etch aspect ratio of 20, but is not limited thereto. Just as an example, the first conductive layer 20 and/or the second conductive layer 22 can have a thickness of about 1 μm to 2 μm, but is not limited thereto. It will be understood that any other suitable dimensions are possible.

For example, the cross-sectional shape of each of the first trenches 14 can be circular and/or the first trenches 14 can be arranged in a concentric configuration (not shown) to reduce stress.

Just as an example, the substrate 12 can be made of silicone, but is not limited thereto. Also, just as an example, the conductive material can be polysilicone, but is not limited thereto. The deposition of polysilicon is highly conformal and can completely seal the narrow first trenches 14.

Now the method of manufacturing a through-wafer via device 10 will be explained with reference to FIG. 1a-c. The method starts with providing the wafer 12 made of a wafer material and having the first wafer surface 12a and the second wafer surface 12b opposing the first wafer surface 12a (see FIG. 1a). Then, the plurality of side by side first trenches 14 are etched from the first wafer surface 12a into the wafer 12 such that the plurality of spacers 16 of the wafer material are formed between the first trenches 14 (see FIG. 1a). Subsequently, the second trench 18 is etched from the second wafer surface 12b into the wafer 12, the second trench 18 being connected to the first trenches 14 (see FIG. 1b). Then, a (first) conductive layer 20 made of a conductive material is provided on the side of the first wafer surface 12a (or on the first wafer surface 12a), the conductive material filling the first trenches 14 such that the first conductive layer 20 has a substantially planar and closed surface. Optionally, a second conductive layer 22 made of the conductive material can be provided on the second wafer surface 12b. In particular, the first conductive layer 20 and the second conductive layer 22 can be applied in the same processing step (e.g. forming a common layer made of the same material), as can be seen in FIG. 1c.

FIG. 2 shows a capacitive micromachined ultrasound transducer (CMUT) assembly 100 according to a first embodiment. The CMUT assembly 100 comprises the through-wafer via device 10. The CMUT assembly 100 further comprises at least one CMUT cell 30 electrically connected to the first conductive layer 20. The CMUT assembly 100 can in particular comprise a plurality of CMUT cells 30, as indicated in FIG. 2 by a first and second CMUT cell 30. It will be understood that any suitable number of CMUT cells can be used. The CMUT cells can form a CMUT ultrasound array, in particular a linear (1-D) array or a matrix (2-D) array. The CMUT assembly can for example be used for 2-D ultrasound imaging or 3-D ultrasound imaging.

The through-wafer via device 10 shown in FIG. 2 can be the through-wafer via device of the embodiment of FIG. 1c. Compared to the through-wafer via device of the embodiment of FIG. 1c, the through-wafer via device 10 of FIG. 2 further comprises an electrical connection 39 (e.g. solder bumps) between the second conductive layer 22 and an ASIC 40. The ASIC 40 is then used for providing electrical signals to the at least one CMUT cell 30 and/or for receiving electrical signals from the at least one CMUT cell 30.

FIG. 2a shows a cross-section of a CMUT cell. The CMUT cell 30 comprises a bottom electrode 30a, a cavity 30b, a membrane 30c arranged on the cavity 30b, and a top electrode 30d. It will be understood that the CMUT cell of FIG. 2a is only an exemplary basic CMUT cell. The CMUT cell of the CMUT assembly 100 according to the present invention can comprise any suitable type of CMUT cell.

FIG. 3a-g each shows a cross-section of a through-wafer via device according to a second embodiment in a different manufacturing stage. The through-wafer via of this second embodiment can for example be used in the CMUT assembly of the first embodiment of FIG. 2 described above.

As already explained with reference to FIG. 1a-c, the method starts with providing the wafer 12 made of a wafer material and having the first wafer surface 12a and the second wafer surface 12b opposing the first wafer surface 12a (FIG. 3a). For example the wafer 12 can be a blank silicon wafer. Preferably, the wafer 12 is as thin a possible to ease the through-wafer via etching, while being thick enough to allow sufficient mechanical support and/or handling. Just as an example, for wafer having a diameter of 150 mm diameter a wafer thickness of 400 μm is a good choice.

Then, as shown in FIG. 3a, the plurality of side by side first trenches 14 are etched from the first (front) wafer surface 12a into the wafer 12 such that the plurality of spacers 16 of the wafer material are formed between the first trenches 14. For example, this can be performed using deep Reactive Ion Etching (RIE).

Subsequently, as can be seen in FIG. 3b, an etch stop layer 13 is applied on the first substrate surface 12b after etching the first trenches 14. For example, the etch stop layer 13 can be made of an oxide and/or can be applied using PECVD. Because PECVD oxide deposits with a poor conformality the first trenches will be automatically sealed after several microns of oxide have been deposited. Just as an example, the thickness of the etch stop layer can be between about 4 μm to 6 μm.

Then, as shown in FIG. 4c, the second trench 18 (or via) is etched from the second (backside) wafer surface 12b into the wafer 12, the second trench 18 being connected to the first trenches 14. The second trench 18 lands or ends in the area in which the first trenches 18 are located. FIG. 4 shows a cross-section and a top-view of the through-wafer via device in the manufacturing stage of FIG. 3b or FIG. 3c.

Referring to FIG. 3d, after etching the second trench 18, the etch stop layer 13 is removed.

Then, as can be seen in FIG. 3e, the wafer 12 is provided with an electrically insulating surface layer 15 (e.g. by oxidation, in particular high temperature oxidation). In this way the side surfaces of the second trench 18, the first trenches 14 and the spacers 16 are provided with the insulating surface layer 15.

Subsequently, as shown in FIG. 3f, a conductive layer 20 made of a conductive material is provided on the side o the first wafer surface 12a, the conductive material filling the first trenches 14 such that the first conductive layer 20 has a substantially planar and closed surface. In the same processing step, the conductive material is also applied to the second wafer surface 12b (thereby forming the second conductive layer 22) and to the surfaces of the second trench 18. In this way the first conductive layer 20 and the second conductive layer 22 are electrically connected Then, as can be seen in FIG. 3g, the first conductive layer 20 on the first (front) wafer surface is patterned. The patterning of the second conductive layer 20 on the second (backside) wafer surface can be done in a later stage. For example, in some CMUT assemblies (not shown here), the first conductive layer 14 can be directly used as the bottom electrode of the CMUT cell. At this stage the fabrication of the (high temperature) through-wafer via device is basically ready.

Then, the processing of the CMUT cell 30 can start. For example, first a bottom electrode 30a is applied on the through-wafer via device 10 (in particular on the first conductive layer 27 or on an additional layer, such as an oxide layer). Then, the remaining part of the CMUT cell 30 is provided, in particular the cavity 30b, the membrane 30c arranged on the cavity 30b, and the top electrode 30d, as explained with reference to FIG. 2a.

Finally, the electrical connection 39 between the second conductive layer 22 and an ASIC 40 can be provided. The CMUT assembly can then be flip-chipped (e.g. by solder bumping) on the ASIC (see FIG. 2).

Just to present one specific application, electronically scanned 3D ultrasound imaging needs beamforming electronics closely integrated with the acoustic elements. In a hybrid CMUT (Capacitive Micromachined Ultrasound Transducer) assembly or device a dedicated through-wafer via device having an array of CMUT transducer cells or elements thereon (together also referred to as silicone IC) is flip-chipped on top of a separate ASIC chip which contains all the electronics to drive each individual transducer cell or element (or pixel). This approach is only possible with a suitable through-wafer via technology which connects the CMUT cell or element on the front side of the through-wafer via device to the ASIC on the backside of the through-wafer via device. Through wafer via technology is usually very difficult because normally it is carried out after active device (i.e. with electronics) processing and is therefore subjected to severe processing restrictions especially with respect to allowable temperature budget. In this special case of a "passive CMUT" device (i.e. without integrated electronics) however, it is possible to first process the through-wafer vias or through-wafer via device, and then to fabricate the CMUT cells. In this way the fabrication of the through-wafer via device can be considerably simplified. In this disclosure an especially attractive processing sequence which yields a planar top surface is discussed. An application with an advanced CMUT device is presented.

It is possible in this case to start with the fabrication of the through wafer via holes and then to fabricate the CMUT devices. Additionally, the requirements for the through wafer via resistance are less stringent as compared to e.g. stacked memory devices. All in all, this makes it possible to use high temperature deposition techniques (thermal oxidation and LPCVD) for the isolation and filling of the via's. This greatly simplifies their fabrication.

The through-wafer via device of the present invention can in particular be used for a capacitive micromachined transducer (CMUT) assembly as described above. However, it will be understood that the through-wafer via device of the present invention can also be used for another device or assembly, such as for example any sensor or MEMS device. For example, the through-wafer via device of the present invention can also be used for a thin-film or micro-machined sensor device, a catheter or guide wire with sensing and/or imaging and integrated electronics, an intra-cardiac echography (ICE) device, an intra-vascular ultrasound (IVUS) device, an in-body imaging and sensing device, an image guided intervention and/or therapy (IGIT) device.

While the invention has been illustrated and described in detail in the drawings and foregoing description, such illustration and description are to be considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims.

In the claims, the word "comprising" does not exclude other elements or steps, and the indefinite article "a" or "an" does not exclude a plurality. A single element or other unit may fulfill the functions of several items recited in the claims. The mere fact that certain measures are recited in mutually different dependent claims does not indicate that a combination of these measures cannot be used to advantage.

Any reference signs in the claims should not be construed as limiting the scope.

The invention claimed is:

1. A through-wafer via device comprising:
   a wafer having a first wafer surface and a second wafer surface opposing the first wafer surface, the wafer consisting of semiconductor material;
   a plurality of side by side first trenches extending from the first wafer surface into the wafer such that a plurality of spacers comprising the wafer material are between the first trenches;
   a second trench extending from the second wafer surface into the wafer, the second trench being connected to the first trenches; and,
   a first conductive layer consisting of conductive material and directly contacting and covering the entirety of the first wafer surface, the conductive material filling the first trenches such that the first conductive layer has a substantially planar and closed surface covering the filled first trenches and forming an electrical connection between the filled trenches.

2. The device of claim 1, further comprising a second conductive layer comprising the conductive material and formed on the second wafer surface.

3. The device of claim 2, wherein the conductive material is formed on surfaces of the second trench such that the first conductive layer and the second conductive layer are electrically connected.

4. The device of claim 2, wherein the second conductive layer is formed on at least part of the second wafer surface surrounding the second trench.

5. The device of claim 2, further comprising an electrical connection between the second conductive layer and an ASIC.

6. The device of claim 1, wherein the second trench has a width extending across a substantial part of or all of the first trenches and/or spacers.

7. The device of claim 1, wherein a width of each first trench and/or of each spacer is in the range between 0.5 µm and 5 µm.

8. The device of claim 1, wherein a depth of each first trench and/or of each spacer is below 100 µm.

9. The device of claim 1, wherein an aspect ratio of the first trenches and/or the second trenches is between 10 and 30.

10. The device of claim 1, the wafer further comprising an electrically insulating surface layer.

11. The device of claim 1, wherein the conductive material is polysilicon.

12. A capacitive micromachined ultrasound transducer (CMUT) assembly comprising the through-wafer via device of claim 1, and at least one CMUT cell electrically connected to the first conductive layer.

13. A method of manufacturing a through-wafer via device, the method comprising:
providing a wafer having a first wafer surface and a second wafer surface opposing the first wafer surface, the wafer consisting of semiconductor material;
etching a plurality of side by side first trenches from the first wafer surface into the wafer such that a plurality of spacers of the wafer material are formed between the first trenches;
etching a second trench from the second wafer surface into the wafer, the second trench being connected to the first trenches, and
providing a first conductive layer consisting of conductive material to directly contact and cover the entirety of the first wafer surface, the conductive material filling the first trenches such that the first conductive layer has a substantially planar and closed surface covering the filled first trenches and forming an electrical connection between the filled first trenches.

14. The method of claim 13, comprising providing a second conductive layer on the second wafer surface.

15. The device of claim 8, wherein the depth of each first trench and/or of each spacer is below 40 µm.

16. The device of claim 9, wherein the aspect ratio of the first trenches and/or the second trenches is between 10 and 20.

17. The CMUT assembly of claim 12, wherein an array of CMUT cells is electrically connected to the first conductive layer.

18. The CMUT assembly of claim 17, wherein an ASIC is electrically connected to a second conductive layer comprising the conductive material and formed on the second wafer surface.

19. The device of claim 1, wherein the plurality of first trenches are arranged in a mesh or grid.

20. The CMUT assembly of claim 12, wherein the at least one CMUT cell comprises a bottom electrode, a cavity, a membrane arranged on the cavity, and a top electrode.

* * * * *